United States Patent
Yang

(10) Patent No.: US 10,888,028 B2
(45) Date of Patent: Jan. 5, 2021

(54) CHASSIS INTELLIGENT AIRFLOW CONTROL AND COOLING REGULATION MECHANISM

(71) Applicant: QUANTA COMPUTER INC., Taoyuan (TW)

(72) Inventor: Chih-Wei Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 246 days.

(21) Appl. No.: 16/012,009

(22) Filed: Jun. 19, 2018

(65) Prior Publication Data
US 2019/0387646 A1    Dec. 19, 2019

(51) Int. Cl.
*H05K 7/20* (2006.01)
*G06F 1/20* (2006.01)

(52) U.S. Cl.
CPC ........... *H05K 7/20745* (2013.01); *G06F 1/20* (2013.01); *H05K 7/20836* (2013.01)

(58) Field of Classification Search
None
See application file for complete search history.

(56) References Cited

U.S. PATENT DOCUMENTS

| | | | |
|---|---|---|---|
| 6,991,533 B2 * | 1/2006 | Tsai | H05K 7/2019 361/695 |
| 7,286,345 B2 * | 10/2007 | Casebolt | G06F 1/20 361/679.48 |
| 7,554,803 B2 * | 6/2009 | Artman | H05K 7/20563 361/679.49 |
| 8,248,793 B2 | 8/2012 | Bash et al. | |
| 8,971,042 B2 * | 3/2015 | Liu | G06F 1/206 361/679.49 |
| 10,334,753 B2 * | 6/2019 | Chu | G06F 1/20 |
| 10,631,432 B2 * | 4/2020 | Gopalakrishna | H05K 7/20181 |
| 2005/0168945 A1 * | 8/2005 | Coglitore | H05K 7/20736 361/695 |
| 2005/0241810 A1 * | 11/2005 | Malone | H05K 7/20727 165/122 |

(Continued)

FOREIGN PATENT DOCUMENTS

| | | |
|---|---|---|
| CN | 1173625 A | 2/1998 |
| CN | 101471785 A | 7/2009 |

(Continued)

OTHER PUBLICATIONS

Extended European Search Report for EP Application No. 19159389.6, dated Sep. 4, 2019.

(Continued)

*Primary Examiner* — Courtney L Smith
(74) *Attorney, Agent, or Firm* — Nixon Peabody LLP

(57) ABSTRACT

An apparatus for dynamic thermal control is provided. The apparatus includes a fan module with multiple fan units, a deflection member configured to direct airflow received from the fan module, and a system component. The apparatus also includes a chassis management controller (CMC). The CMC is coupled to the fan module, deflection member, and the system component. The CMC is configured to dynamically control the deflection member to direct airflow from the fan module to the system component by accounting for at least one environmental element within the apparatus.

16 Claims, 8 Drawing Sheets

(56) References Cited

U.S. PATENT DOCUMENTS

| | | |
|---|---|---|
| 2007/0293137 A1 | 12/2007 | Crippen et al. |
| 2010/0155047 A1* | 6/2010 | Lin ................. H01L 23/467 |
| | | 165/288 |
| 2011/0235272 A1* | 9/2011 | Bash ............... H05K 7/20781 |
| | | 361/692 |
| 2012/0197828 A1 | 8/2012 | Yi |
| 2013/0083481 A1* | 4/2013 | Goto ............... H05K 7/20836 |
| | | 361/695 |
| 2018/0077823 A1* | 3/2018 | Tunks ................. G06F 1/20 |
| 2019/0343022 A1* | 11/2019 | Tseng ............. H05K 7/20145 |

FOREIGN PATENT DOCUMENTS

| | | |
|---|---|---|
| CN | 104460880 A | 3/2015 |
| CN | 105759922 A | 7/2016 |
| CN | 106020394 A | 10/2016 |
| CN | 108089440 A | 5/2018 |
| JP | H01-129497 A | 5/1989 |
| JP | H10-270882 A | 10/1998 |
| JP | 2007-124853 A | 5/2007 |
| JP | 2009123887 A | 6/2009 |
| JP | 2014183079 A | 9/2014 |
| JP | 2016-122312 A | 7/2016 |
| TW | 535488 B | 6/2003 |

OTHER PUBLICATIONS

TW Office Action for Application No. 107145751, dated Oct. 2, 2019, w/ First Office Action Summary.
TW Search Report for Application No. 107145751, dated Oct. 2, 2019, w/ First Office Action.
JP Office Action for Application No. 2019-078364, dated Jun. 30, 2020, w/ First Office Action Summary.
CN Office Action for Application No. 201910005139.8, dated Aug. 28, 2020, w/ First Office Action Summary.
CN Search Report for Application No. 201910005139.8, dated Aug. 28, 2020, w/ First Office Action.

\* cited by examiner

CHASSIS INTELLIGENT AIRFLOW CONTROL AND COOLING REGULATION MECHANISM

FIELD OF THE INVENTION

This application relates to cooling systems, and more particularly to a cooling system with improved airflow.

BACKGROUND

Computer server systems in modern data centers are commonly mounted in specific configurations on server racks in which a number of computing modules, such as server trays, server chassis, server sleds, server blades, etc., are positioned and stacked on top of each other. Rack mounted systems allow for vertical arrangement of the computing modules to use space efficiently. Generally, each computing module can slide into and out of the server rack, and various cables such as input/output (I/O) cables, network cables, power cables, etc., connect to the computing modules at the front or rear of the rack. Each computing module contains one or more computer servers or may hold one or more computer server components. For example, computing modules includes hardware circuitry for processing, storage, network controllers, disk drives, cable ports, power supplies, etc.

In many configurations, fans in rack mounted systems are configured to move air from the front of a chassis enclosure through the computing modules and other components, and exhaust the air out the back of the chassis enclosure. Many computing modules and other components in the chassis generate heat when operating. Because of the high density of the computing modules and other component in most conventional chassis, a significant amount of heat is generated within the chassis. Therefore, the flow of air through the chassis enclosure is essential for preventing the overheating of the computing modules and other components within the chassis. Accordingly, there is a significant interest in improving fan performance for computer server systems and other types of computing devices.

SUMMARY

The following is a simplified summary of one or more embodiments in order to provide a basic understanding of present technology. This summary is not an extensive overview of all contemplated embodiments of the present technology. It is intended neither to identify key or critical elements of all examples, nor to delineate the scope of any or all aspects of the present technology. Its sole purpose is to present some concepts of one or more examples in a simplified form as a prelude to the more detailed description that is presented later.

An apparatus for dynamic thermal control is provided. The apparatus includes a fan module with multiple fan units, a deflection member configured to direct airflow received from the fan module, and a system component. The apparatus also includes a chassis management controller (CMC). The CMC can be coupled to the fan module, deflection member, and the system component. The CMC is configured to dynamically control the deflection member to direct airflow from the fan module to the system component by accounting for at least one environmental element within the apparatus.

In some embodiments, the CMC is configured to actuate the deflect member to direct airflow from the fan module to the system component, which is operating at a utilization rate that exceeds a specified threshold. The environment element can include utility of the system component, a read/write status of the system component, or temperature of the system component. In some embodiments, the CMC is configured to determine the status of the system component to adjust airflow volume of the fan module. In some embodiments, determining the status of the system component can include detecting when the system component is not inserted into the network system.

In some embodiments, the system component can be configured as a storage node. In other embodiments, the system component can be configured as a computing node. The CMC can incorporate an artificial neural network (ANN) to dynamically control the engagement angle $\Theta$ of the deflect member and airflow rate of the fan module.

A method for dynamic thermal control within a network system is also provided. The method includes determining a status of a fan module and of a system component. The method also includes detecting ambient, inlet and outlet temperatures within the network system. Finally, the method includes adjusting a deflection member configured to direct airflow received from the fan module by an engagement angle $\Theta$ based on the determined statuses and the detected temperatures.

In some embodiments, the method can also include sending a pulse width modulation (PWM) signal to the fan module to increase or decrease fan speed, based on the determined statuses and the detected temperatures. In some embodiments, determining a status of the system component includes determining whether the system component is installed within the network system. Furthermore, the method can include determining whether the system component is not installed within the network system, and thereby instructing the fan module to reduce or terminate airflow.

The method can also include incorporating an artificial neural network (ANN) to dynamically adjust the engagement angle $\Theta$ of the deflect member and the speed of fans within the fan module. In some embodiments, the method can include utilizing the determined statuses and the detected temperatures to create a multi-layer perceptron (MLP) input. The engagement angle $\Theta$ of the deflect member can be determined by calculating results of the trained MLP neural network output. Furthermore, the airflow rate of the fan module can be determined by calculating results of the trained MLP neural network output.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1:
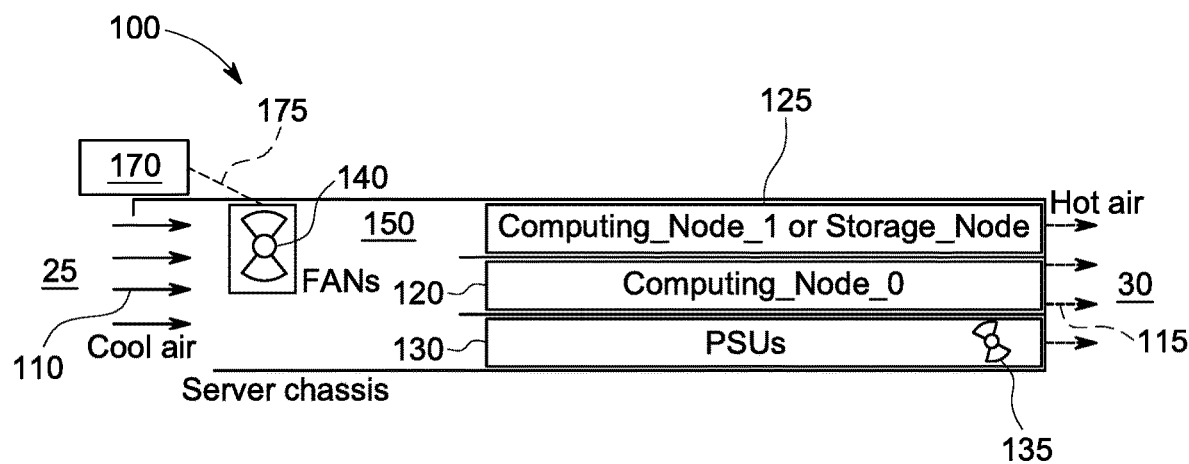
FIG. 1 illustrates a simplified block diagram of an example network system in the prior art.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An apparatus in accordance with the present disclosure can include a fan module, system components, a chassis management controller (CMC), and a deflect member. The CMC is configured to dynamically increase or decrease an engagement angle of the deflection member to direct airflow from the fan module. The CMC is able to dynamically control the deflection member by accounting for environmental elements within the apparatus. The CMC can account for many parameters of the network system, including, but not limited to a system component's present utility, a read/write status of the system component, and the temperature of the system component. For example, the CMC can detect that a system component is operating at a higher utilization rate than its surrounding counterparts, causing its temperature to increase. The CMC can actuate the deflect member to direct a higher concentration of airflow from the fan module to the system component operating at a higher utilization rate. Furthermore, the CMC can determine the status of the system component to adjust the volume of airflow. For example, the CMC is also configured to turn off the airflow when the CMC detects a system component is not inserted into the network system. The disclosed apparatus not only improves the efficiency of heat dissipation from network devices, but it conserves the network system power consumption.

FIG. 1 illustrates a simplified block diagram of an example network system 100 in the prior art. The network system 100 includes a server chassis 150 with a first distal end 25 and an opposing distal end 30. The server chassis 150 also includes a fan module 140. The server chassis 150 can also include system components 125 and 120. The system component 125 can be configured as a computing node. The system component 120 can also be configured as a storage node. For the purposes of this example, the system component 120 is represented as a computing node. The server chassis can also include a power supply unit 130. The power supply unit 130 can include its own fan (PSU fan 135), configured to assist the fan module 140 in heat dissipation.

Some data centers utilize a hot aisle/cold aisle layout design for server racks and other computing equipment, to conserve energy and lower cooling costs by managing air flow effectively. In its simplest form, hot aisle/cold aisle data center design involves lining up server racks in alternating rows with cold air intakes facing one direction, and hot air exhausts facing the opposite direction. The rows composed of rack fronts are called cold aisles. Typically, cold aisles face air conditioner output ducts. The rows, into which heated exhausts pour, are called hot aisles. Typically, hot aisles face air conditioner return ducts. For the purposes of this example, the first distal end 25 can be located at the cold aisle, while the second distal end 30 can be located at the hot aisle.

The fan module 140 is configured to draw cool air 110 in from the first distal end 25. The cool air 110 can be drawn in and directed over and around the system components 120, 125 and the power supply unit 130. The server chassis 150 can exhaust hot air 115 at the second distal end 30. The fan module 140 is fixed within the server chassis 150. The fan speed of individual fans within the fan module 140 can be controlled by a chassis management controller (CMC) 170. The CMC 170 is able to control the speed adjustment of the fan module 340 through a pulse-width modulation (PWM) signal 175. This process is described in more detail below with respect to FIG. 2.

Figure 2:
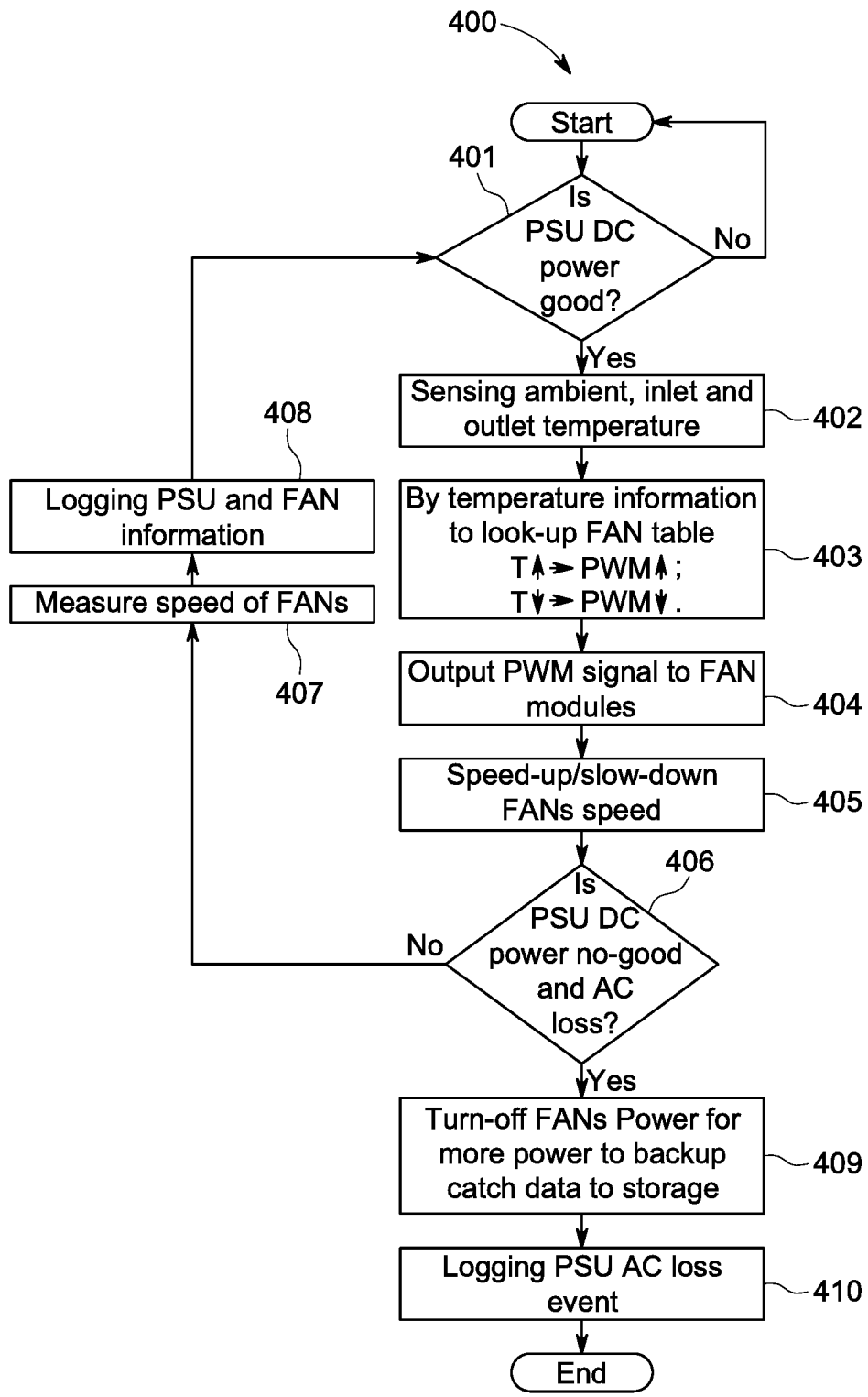
FIG. 2 depicts a flow chart describing the process for traditional server thermal control using the CMC.

FIG. 2 depicts a flow chart describing the process 400 for server thermal control using the CMC 170. As can be seen in FIG. 2, the process starts with communication between the CMC and the power supply unit in step 401. The CMC determines if the power supply unit is supplying sufficient power to the server chassis. Where the power supply unit is found to be providing less than adequate power, the process is restarted, and the assessment is repeated at step 401. Upon determining that the CMC is providing sufficient power to the server chassis, the process advances to step 402. At step 402, the server chassis can be configured with temperature sensors to detect the ambient, inlet and outlet temperatures within the server chassis. The sensed temperatures can be conveyed to the CMC.

A FAN Table can be maintained by the CMC. At step 403, the FAN Table can provide the CMC with a recommended PWM signal to achieve a specific temperature. Specifically, the FAN Table can indicate that to accomplish a temperature increase the CMC should output an increase-PWM signal. Similarly, the FAN Table can indicate that to accomplish a temperature decrease the CMC should output a decrease-PWM signal. Based on the provided temperature information, the CMC can output a PWM signal to the fan module, at step 404. At step 405, the output PWM signal will cause the fan module to increase fan speed or decrease fan speed.

The process 400 determines at step 406 whether a system component is operating in normal condition without power loss. If the process 400 determines the system component is not operating in normal condition or suffering from power loss, the process advances to step 409. At step 409, the power to the fan module is terminated. The power from the power supply unit is redirected to backup cache data to a storage module (not shown). The power loss event is logged for later assessment at step 410. After logging the power loss event, the process 400 concludes.

Conversely, if the process 400 determines the system component is operating in a normal condition and not suffering from power loss, the process advances to steps 407 and 408. At step 407, the speed of the fans within the fan module are recorded. The fan information and the power supply unit information are logged at step 408, and the process 400 repeats itself at step 401. The process 400 allows the CMC to control the speed of the fans within the fan module according to PWM signal outputs and the temperature information in the FAN Table.

Both the server chassis 150 of FIG. 1 and the process 400 of FIG. 2 lack a mechanism designed to specifically direct airflow from the fans to a specific system component. Therefore, the airflow to a specific node cannot be controlled for specific nodes. As a result, fans incorporated in the rack mounted systems will continue to operate even if certain nodes require more cooling as a result of higher processing power.

Moreover, the server chassis 150 of FIG. 1 and the process 400 of FIG. 2 do not account for the removal of a system component that results in a leaking issue. Referring momentarily to FIG. 1, system component 125 can removed to be serviced or repaired. Without accounting for the removed component, airflow will flow through the vacant space previously occupied by system component 125, causing inefficient airflow at the system component 120 and the power supply unit 130. This leaking issue can impact heat dissipation performance, causing one of the present system components to throttle to a lower-frequency mode or shutdown. This not only affects the internal airflow design, but results in a waste of system resources. The present disclosure provides an apparatus and method employed within a network system for dynamically controlling airflow.

Figure 3:
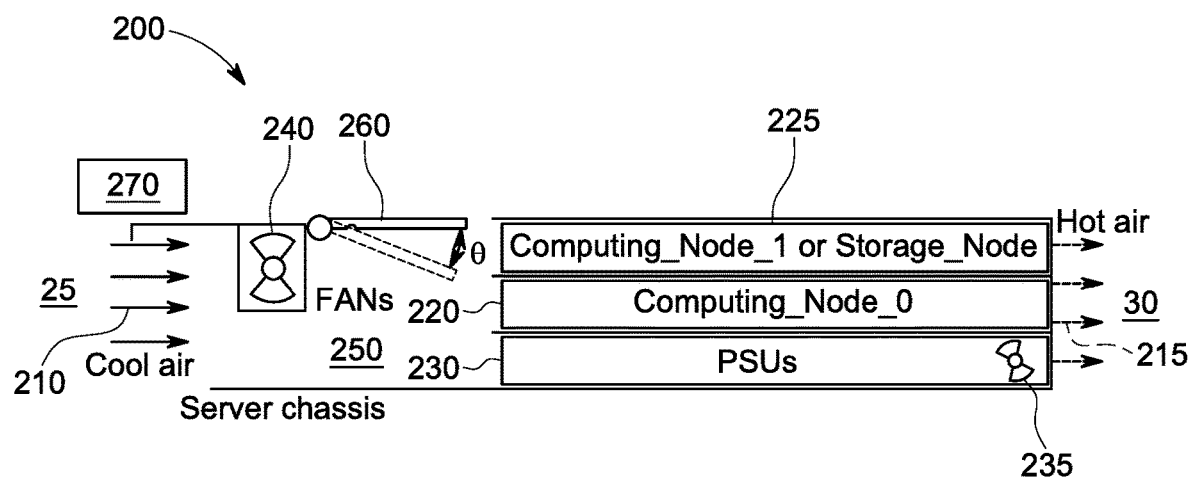
FIG. 3 illustrates a simplified block diagram of an example network system, in accordance with an embodiment of the disclosure.

FIG. 3 illustrates a simplified block diagram of an example network system 200 in accordance with an embodiment of the disclosure. The network system 200 includes a server chassis 250 with a first distal end 25 and an opposing distal end 30. The server chassis 250 can include a fan module 240. The server chassis 250 can also include system components 225 and 220. The system component 225 can be configured as a computing node. The system component 220 can also be configured as a storage node. For the purposes of this example, the system component 220 is represented as a computing node. However, the system component 220 can be configured as a storage node or a combination thereof.

The server chassis 250 can also include a power supply unit 230. The power supply unit 230 can include its own fan (PSU fan 235), configured to assist the fan module 240 in heat dissipation. For the purposes of this example, the first distal end 25 can be located at a cold aisle, while the second distal end 30 can be located at a hot aisle. The fan module 240 is configured to draw cool air 210 in from the first distal end 25. The server chassis 250 can exhaust hot air 215 at the second distal end 30.

The server chassis 250 can also include a deflect member 260. The deflect member 260 can be adjusted to direct airflow received from the fan module 240 to specific system components 220, 225 and the power supply unit 230. The deflect member 260 can be controlled by a chassis management controller (CMC) 270. The functions of the CMC 270 with respect to the deflect member 260 are discussed in more detail with respect to FIG. 5. The deflect member 260 can be adjusted at an engagement angle Θ. It should be understood that more than one deflect member can be present within the server chassis 250. Moreover, the deflect member can be positioned at multiple positions within the server chassis 250, relative to the fan module 240.

The CMC 270 can be configured to dynamically increase or decrease an engagement angle Θ of the deflect member 260 by accounting for environmental elements within the network system 200. The CMC 270 can account for many parameters of the network system 200, including, but not limited to a CPU's present utility, a read/write status of a storage device, and node temperature. For example, the CMC 270 can detect that the system component 220 is operating at a higher utilization rate than the system component 225, causing its temperature to increase. The CMC 270 can actuate the deflect member 260 to position itself at an engagement angle Θ such that it directs a higher concentration of airflow from the fan module 240 to the system component 220.

Furthermore, the CMC 270 can determine the node status to adjust the volume of airflow. For example, if the CMC 270 determines that the system component 225 has been removed, the CMC 270 can cause the fan module 240 to shut down or reduce air flow. This is described in further detail below with respect to FIGS. 5-6.

Figure 4:
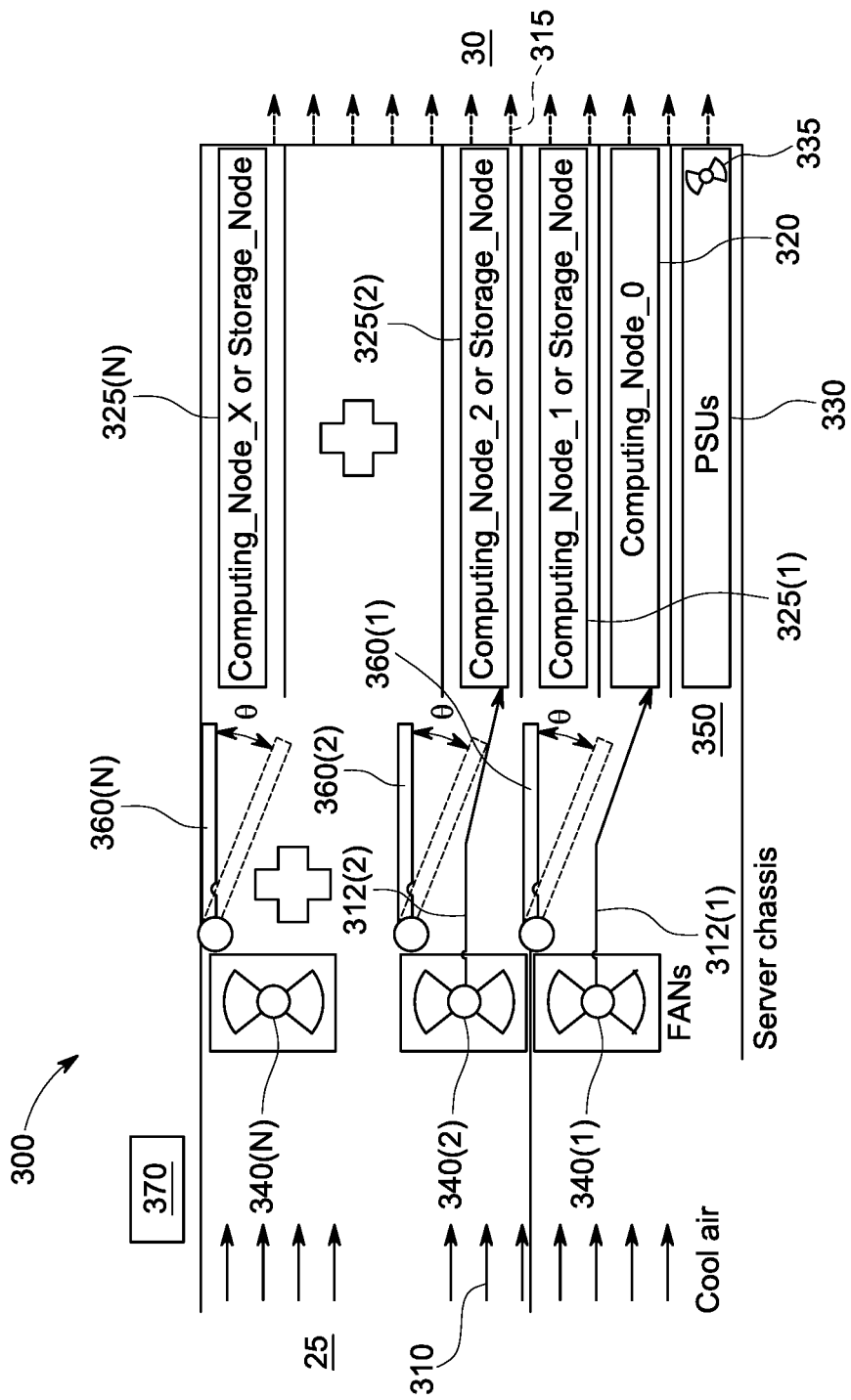
FIG. 4 illustrates a simplified block diagram of an example network system encompassing multiple-height and multiple node chassis structures, in accordance with an embodiment of the disclosure.

FIG. 4 illustrates a simplified block diagram of an example network system 300 in accordance with an embodiment of the disclosure. The network system 300 includes a server chassis 350 with a first distal end 25 and an opposing distal end 30. The server chassis 350 can be referred to as a stack-up chassis structure. The server chassis 350 can include multiple computing nodes, multi-storage nodes, fan modules and corresponding deflect members. As illustrated herein, the server chassis 350 can include multiple fan modules 340(1) and 340(2) to a finite number of fan modules, represented as 340(N) (hereinafter "340"). The server chassis 350 can also include multiple system components 325, 325(1), and 325(2) to a finite number of system components, represented as 325(N). Although one is shown here for simplicity, the server chassis 350 can also include a system component 320. The system component 320 can be configured as a computing node. Although the system component 320 is represented herein as a computing node, the system component 320 can also be configured as a storage node.

Although one is shown here for simplicity, the server chassis 350 can also include multiple power supply units 330. Each power supply unit 330 can include its own fan (PSU fan 335), configured to assist the fan modules 340 in heat dissipation. The fan module 340 is configured to draw cool air 310 in from the first distal end 25. Through the process of heat convection, the server chassis 350 can exhaust hot air 315 at the second distal end 30.

The server chassis 350 can also include multiple deflect members 360(1) and 360(2) to a finite number of deflect members 360(N) (hereinafter "360"). The deflect member 360 can be adjusted to direct airflow received from the fan module 340 to specific system components 320, 325 and the power supply unit 330. The deflect member 360 can be controlled by a chassis management controller (CMC) 370. The CMC 370 can be configured to dynamically increase or decrease an engagement angle Θ of the deflect member 360.

The CMC 370 is configured to dynamically control the deflect member 360 by accounting for environmental elements within the server chassis 350. For example, the CMC 370 can detect that the system component 320 is operating at a higher utilization rate than the system component 325(1), causing its temperature to increase. The CMC 370 can actuate the deflect member 360(1) to position itself at an engagement angle Θ such that it directs a higher concentration of airflow 312(1) from the fan module 340(1) to the system component 320.

Furthermore, the CMC 370 can determine the status of each system component to adjust the volume of airflow. For example, the CMC 370 can determine the system component 325(2) is the sole operating system component receiving airflow 312(2) from the fan module 320(2). As a result, the CMC 370 can actuate the deflect member 360(2) to adjust the engagement angle Θ such that it directs a higher concentration of airflow 312(2) specifically to the system component 325(2). Because the system component 325(2) is the sole system component receiving airflow from fan module 340(2), the CMC 370 can also cause the fan module 240(2) to reduce airflow 312(2).

As discussed above with respect to FIGS. 3 and 4, the CMC is also able to control the engagement angle Θ of the deflect member. The CMC can incorporate management algorithms to dynamically control the engagement angle Θ of the deflect member. This process is described in more detail below with respect to FIGS. 5 and 6.

Figure 5:
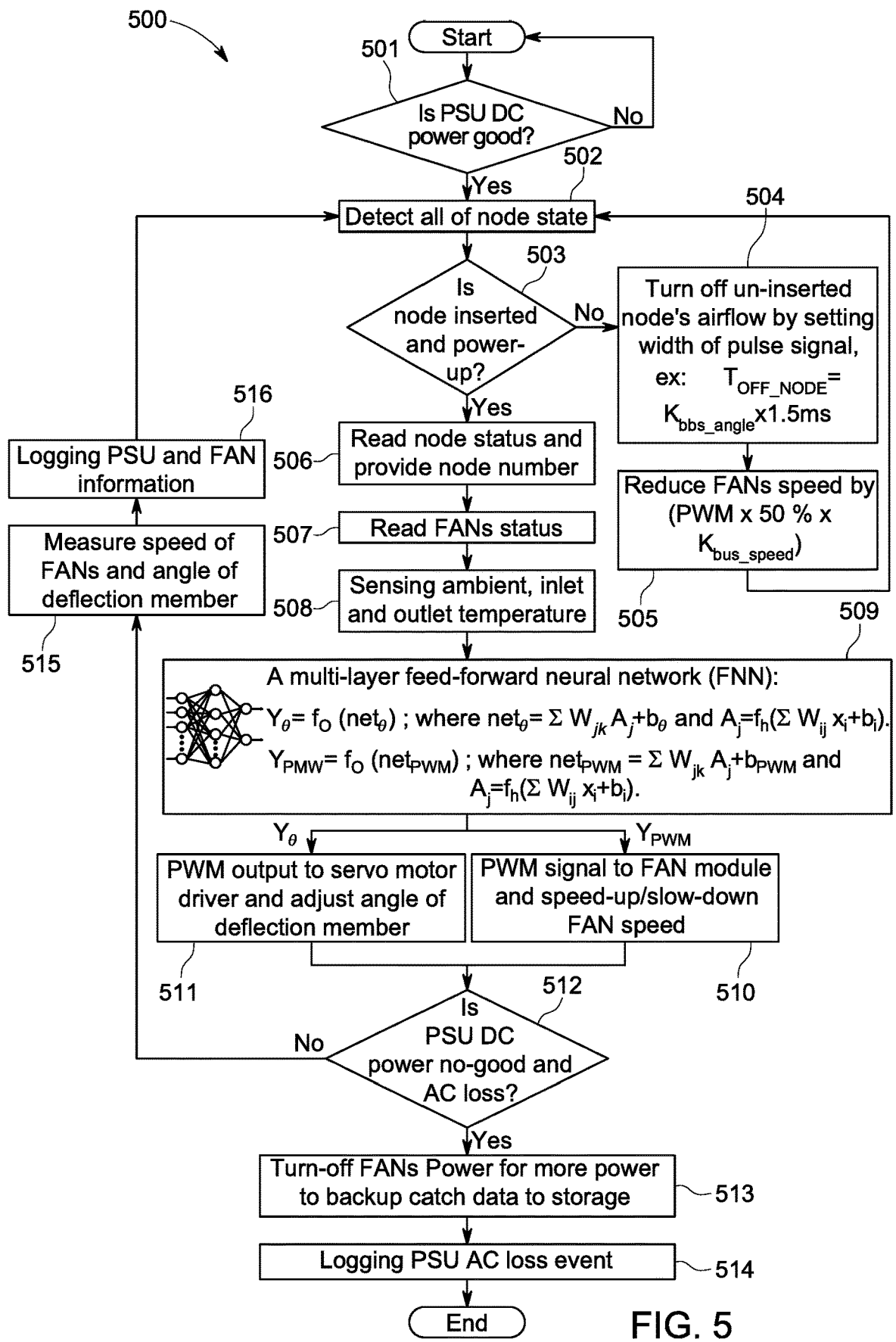
FIG. 5 depicts a flow chart describing the process for server thermal control using the CMC, in accordance with an embodiment of the disclosure.

FIG. 5 depicts a flow chart describing the process 500 for network system thermal control using the CMC. As can be seen in FIG. 5, the process starts with communication between the CMC and the power supply unit in step 501. The CMC determines if the power supply unit is supplying sufficient power to the server chassis. Where the power supply unit is found to be providing less than adequate power, the process is restarted and the assessment is repeated at step 501. Upon determining that the CMC is providing sufficient power to the server chassis, the process advances to step 502.

At step 502, the CMC can determine status of each node within the server chassis. For each node installed within the server chassis, the CMC can determine whether the node is inserted and powered-on at step 503. If the CMC determines the node is not inserted or powered on, the process advances to step 504. At step 504, the CMC directs the fan module to reduce or terminate airflow. Specifically, the CMC can turn off airflow to the un-inserted node by setting a duty cycle signal $T_{OFF\_NODE}$ to change engagement angle Θ of deflect member. The process advances to step 505, where the remaining fans within the fan module can be reduced as a result of the reduced workload. The process 500 advances back to step 502, until it cycles through all of the detected nodes within the server chassis.

Referring back to step 503, if the CMC determines the node is inserted or powered on, the process advances to step 506. At step 506, the CMC reads the node status and accounts for the node number. The process 500 advances to step 507, where the CMC reads the status of the fans within the fan module. The server chassis can be configured with temperature sensors to detect the ambient, inlet and outlet temperatures within the server chassis. At step 508, the sensed temperatures can be conveyed to the CMC. The process 500 advances to the step 509, where the CMC actuates the deflect member and the fan module. For example, based on the node status, fan status, ambient, and inlet and outlet temperatures within the server chassis, the CMC can determine the preferred engagement angle Θ and fan speed. The CMC can incorporate management algorithms to dynamically control the engagement angle Θ of the deflect member. Exemplary management algorithms are described in more detail below with respect to FIGS. 6-9. At step 511, the CMC can send a command to the deflect member to adjust the preferred engagement angle Θ. Furthermore, at step 510, the CMC can output a PWM signal to the fan module to cause the fan module to increase fan speed or decrease fan speed. This is discussed in more detail with respect to FIG. 9.

At step 512, the process 500 determines whether a system component is operating in normal condition without power loss. If the process 500 determines the system component is not operating in normal condition or suffering from power loss, the process advances to step 513. At step 513, the power to the fan module is terminated. The power from the power supply unit is redirected to backup cache data to a storage module (not shown). The power loss event is logged for later assessment at step 514. After logging the power loss event the process 500 concludes.

Conversely, if the process 500 determines the system component is operating in a normal condition and not suffering from power loss, the process advances to steps 515 and 516. At step 515, the engagement angle Θ of the deflect member and the speed of the fans within the fan module are recorded. The fan information and the power supply unit information is logged at step 516. The process 500 advances back to step 502, until it cycles through all of the detected nodes within the server chassis. The process 500 allows the CMC to control the engagement angle Θ of the deflect member and the speed of the fans within the fan module based on the node status, fan status, ambient, and inlet and outlet temperatures within the server chassis.

Figure 6:
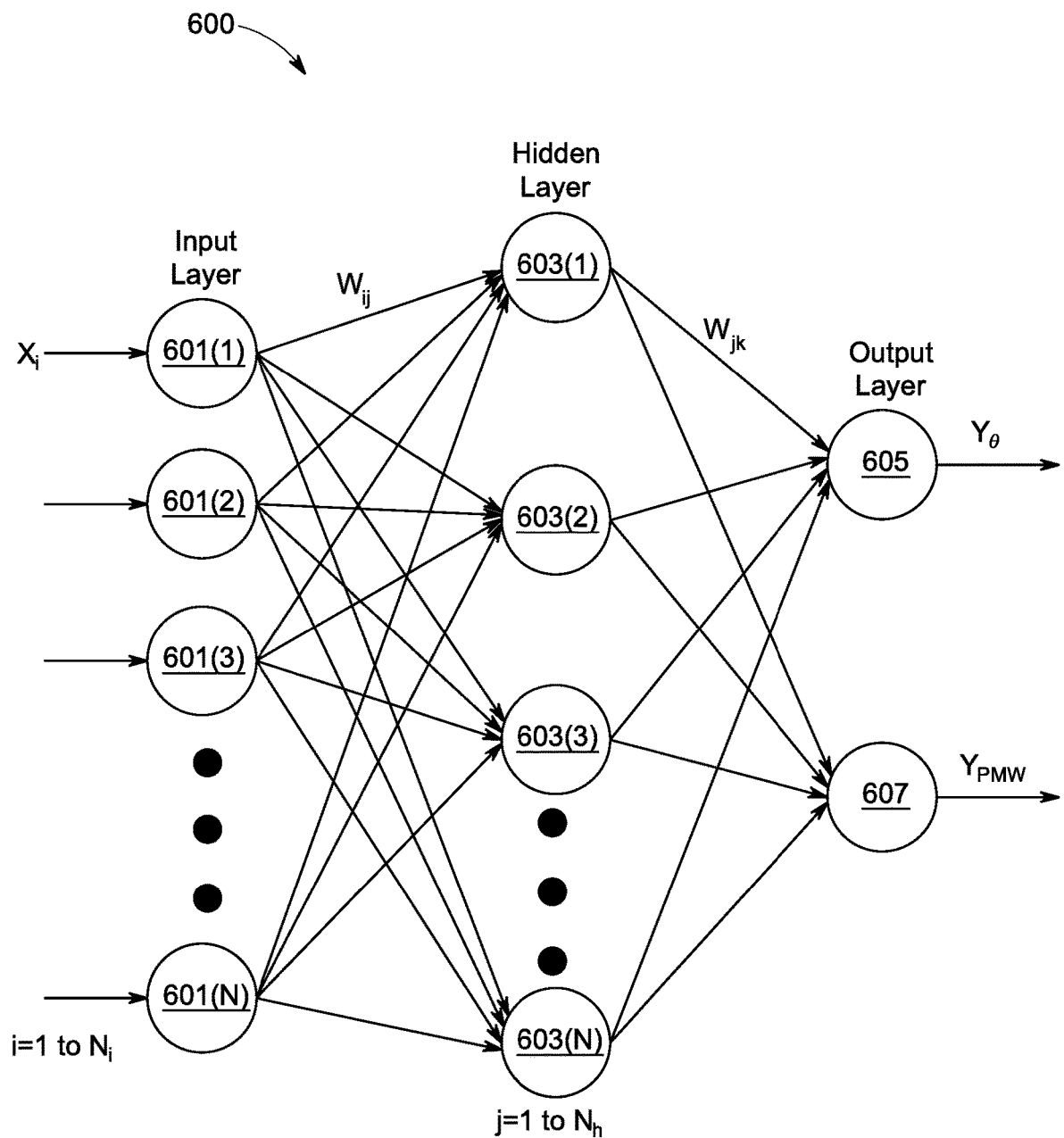
FIG. 6 shows an exemplary neural network incorporated by the CMC to dynamically control the engagement angle Θ of the deflect member and the speed of the fans within the fan module, in accordance with an embodiment of the disclosure.

FIG. 6 shows an exemplary neural network 600 incorporated by the CMC to dynamically control the engagement angle Θ of the deflect member and the speed of the fans within the fan module. In some embodiments, the CMC can incorporate an artificial neural network (ANN) to dynamically control the engagement angle Θ of the deflect member and the speed of the fans within the fan module. As discussed with respect to process 500, the CMC can read the node status, fan status, ambient, inlet and outlet temperatures within the server chassis. The ANN can include input elements 601(1)-601(N) (hereinafter "601"), which receive input $X_i$. The input elements are sent to neurons 603(1)-603(N) (hereinafter "603"), which change their internal state (activation) according to that input, and produce output $Y_\Theta$ and $Y_{PWM}$ depending on the input and activation. The output $Y_\Theta$ represents the engagement angle Θ. Furthermore, the $Y_{PWM}$ represents speed of the fans within the fan module. The readings received in steps 506-508 of process 500 can be input $X_i$ at multiple neurons, creating a multi-layer perceptron (MLP) input.

The input 601 can have connections to the neurons 603 with a weight $W_{ij}$, which adjusts as learning proceeds. The weight $W_{ij}$ can increase or decrease the strength of the signal at a connection. The output $W_{jk}$ of each neuron 603 can be calculated by a non-linear function of the sum of its inputs. In some embodiments, the neurons 603 can have a threshold such that the signal is sent only if the aggregate signal crosses that threshold. The combined output from the neurons 603 can be delivered to the output layers 605 and 607. The output $Y_\Theta$ of each neuron 603 can be calculated by a non-linear function of the sum of its inputs. Similarly, the output $Y_{PWM}$ of each neuron 603 can be calculated by a non-linear function of the sum of its inputs. This is shown in FIG. 7 implementing the Summation Unit.

Figure 7:
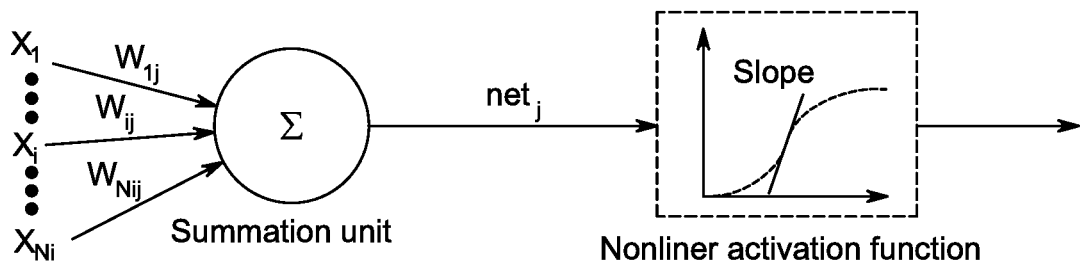
FIG. 7 illustrates a multi-layer perceptron (MLP) input where multiple layers of input nodes are inserted into a neuron.

FIG. 7 illustrates an MLP input, where at least three layers of input nodes $X_i$-$X_N$ are inserted into a neuron (referred to as a Summation Unit). The Summation Unit can use a nonlinear activation function to produce a net output $net_j$. The MLP can train the weighting vectors according to the backpropagation algorithm. It is understood that backpropagation requires a known, desired output for each input value—it is therefore considered to be a supervised learning method. In this case, a mechanism algorithm can be incorporated that is based on supervised learning and training data set to train the weighting vectors.

Figure 8:
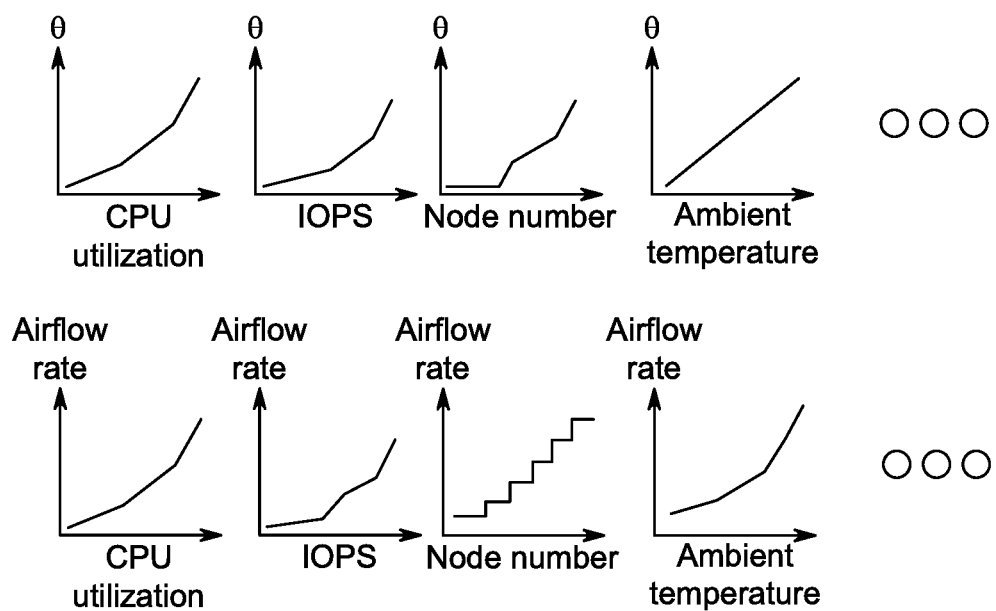
FIG. 8 illustrates an exemplary training set used in a mechanism algorithm.

FIG. 8 illustrates an exemplary training set used in the mechanism algorithm. The exemplary training set can provide preset relationships with the engagement angle Θ and CPU utilization, input/output operations per second (IOPS), node number, and ambient temperature. Furthermore, the exemplary training set can provide preset relationships with the airflow rate and CPU utilization, TOPS, node number, and ambient temperature. The ANN can iteratively make predictions on the training data and use the training set as a reference. The ANN learning is terminated when the mechanism algorithm achieves an acceptable level of performance.

Momentarily referring back to FIG. 6, the CMC receives the output $Y_Θ$ to determine the acceptable engagement angle Θ of the deflect member. Furthermore, the CMC receives the output $Y_{PWM}$ to determine the acceptable speed of the fans within the fan module. Based on the output $Y_Θ$, the CMC communicates with a servo motor (not shown) to actuate the engagement arm using PWM signals. This is discussed in more detail with respect to FIG. 9. The CMC can communicate directly with the fan module to adjust the speed of the fans within the fan module using PWM signals.

Figure 9:
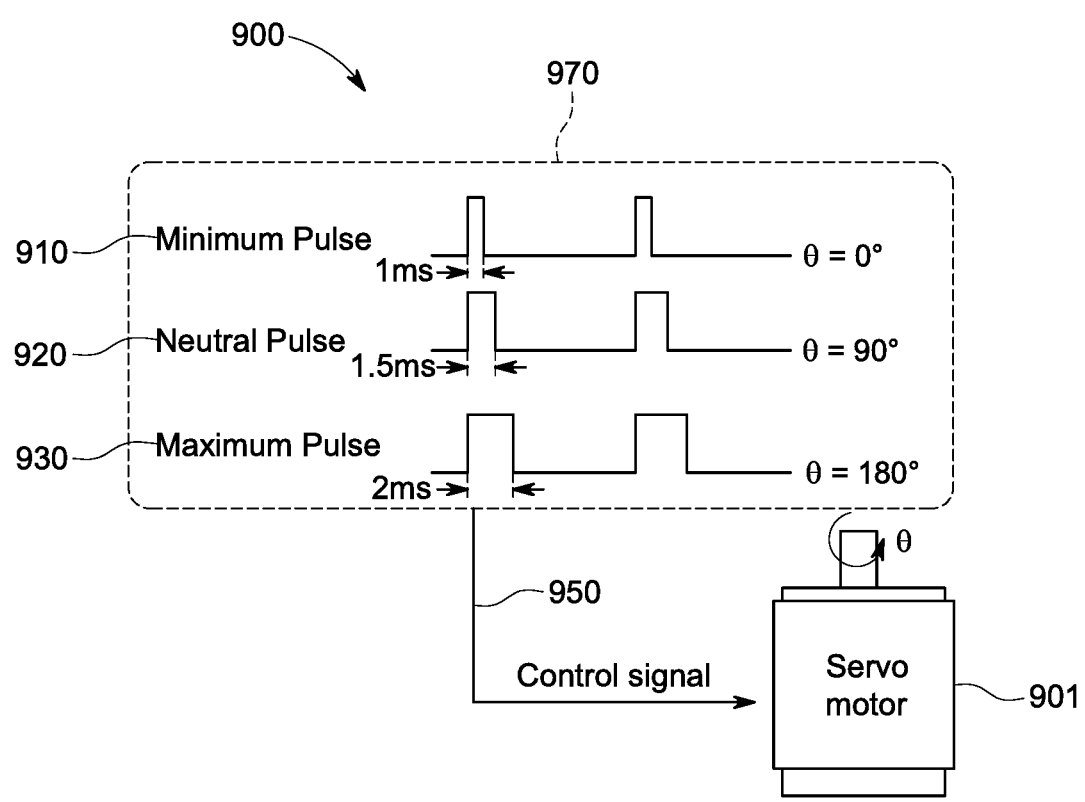
FIG. 9 illustrates an exemplary servo motor configured to adjust the deflect member based on received PWM signals from the CMC, in accordance with an embodiment of the disclosure.

FIG. 9 illustrates an exemplary network system 900 for adjusting a deflect member (not shown). The network system 900 can include servo motor 901 configured to adjust the deflect member and a CMC 970. The CMC 970 can prepare PWM signals to forward to the servo motor 901. For exemplary purposes, the PWM signals can range from minimum pulse to maximum pulse. The minimum pulse 910 PWM signal can be sent to the servo motor 901 via control signal 950 where the CMC 970 is requesting an engagement angle Θ of 0 degrees. The neutral pulse 920 PWM signal can be sent to the servo motor 901 via control signal 950 where the CMC 970 is requesting an engagement angle Θ of 90 degrees. Finally, the maximum pulse 930 PWM signal can be sent to the servo motor 901 via control signal 950 where the CMC is requesting an engagement angle Θ of 180 degrees. It should be noted that the CMC can prepare PWM signals for all angles between 0 and 180 degrees. Furthermore, the control signal 950 can include a series of repeating pulses of variable width where either the width of the pulse or the duty cycle of a pulse train determines the position to be achieved by the servo motor 901. The PWM signal is based on the results of the MLP neural network output $Y_Θ$ and $Y_{PWM}$ of FIG. 6.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. An apparatus for dynamic thermal control, comprising:
a fan module comprising a plurality of fan units;
a deflect member configured to direct airflow received from the fan module;
at least one system component; and
a chassis management controller (CMC) coupled to the fan module, deflect member, and the at least one system component,
wherein the CMC is configured to utilize an artificial neural network (ANN) to dynamically control an engagement angle Θ of the deflect member and an airflow rate of the fan module to direct airflow from the fan module to the system component by accounting for at least one environmental element within the apparatus.

2. The apparatus of claim 1, where the CMC is configured to actuate the deflect member to direct airflow from the fan module to the system component operating at a utilization rate that exceeds a specified threshold.

3. The apparatus of claim 1, where the environment element comprises at least one of: usage rate of the system component, a read/write status of the system component, and temperature of the system component.

4. The apparatus of claim 1, where the CMC is configured to determine the status of the system component to adjust airflow volume of the fan module.

5. The apparatus of claim 4, where determining the status of the system component comprises detecting the system component is not inserted into the network system.

6. The apparatus of claim 1, where the system component is configured as a storage node.

7. The apparatus of claim 1, where the system component is configured as a computing node.

8. A method for dynamic thermal control within a network system, comprising:
determining a status of a fan module and of at least one system component;
detecting ambient, inlet and outlet temperatures within the network system;
determining, using an artificial neural network (ANN), a preferred engagement angle Θ of a deflect member and a preferred fan speed of fans within the fan module based at least on the determined statuses and the detected temperatures; and
setting an engagement angle of the deflect member to the preferred engagement angle Θ, and setting a fan speed of the fans within the fan module to the preferred fan speed, so as to direct airflow received from the fan module to the at least one system component.

9. The method of claim 8, further comprising sending a pulse width modulation (PWM) signal to the fan module to increase fan speed or decrease fan speed, based on the determined statuses and the detected temperatures.

10. The method of claim 8, wherein determining a status of the at least one system component comprises determining whether the at least one system component is installed within the network system.

11. The method of claim 10, wherein upon determining the at least one system component is not installed within the network system, and thereby instructing the fan module to reduce or terminate airflow.

12. The method of claim 1, further comprising utilizing the determined statuses and the detected temperatures to create a multi-layer perceptron (MLP) input.

13. The method of claim 12, wherein the preferred engagement angle Θ of the deflect member is determined by calculating results of the trained MLP neural network output.

14. The method of claim 12, wherein the preferred fan speed of fans within the fan module is determined by calculating results of the trained MLP neural network output.

15. The method of claim 8, wherein the system component is configured as a storage node.

16. The method of claim 8, wherein the system component is configured as a computing node.

* * * * *